US007045267B2

(12) United States Patent
Yoon et al.

(10) Patent No.: US 7,045,267 B2
(45) Date of Patent: *May 16, 2006

(54) RESIST COMPOSITION COMPRISING PHOTOSENSITIVE POLYMER HAVING LACTONE IN ITS BACKBONE

(75) Inventors: Kwang-sub Yoon, Seoul (KR);
Dong-won Jung, Yongin (KR);
Si-hyeung Lee, Suwon (KR);
Hyun-woo Kim, Sungnam (KR); Sook Lee, Seoul (KR); Sang-gyun Woo, Suwon (KR); Sang-jun Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

This patent is subject to a terminal disclaimer.

(21) Appl. No.: 10/349,917

(22) Filed: Jan. 24, 2003

(65) Prior Publication Data

US 2004/0018442 A1  Jan. 29, 2004

Related U.S. Application Data

(62) Division of application No. 09/901,569, filed on Jul. 11, 2001, now Pat. No. 6,537,727.

(30) Foreign Application Priority Data

Dec. 12, 2000  (KR) .............................. 2000-75485

(51) Int. Cl.
*G03F 7/038* (2006.01)
*C07D 307/00* (2006.01)
(52) U.S. Cl. ................... 430/270.1; 430/905; 524/592; 525/191; 525/206; 526/270; 526/271; 526/266
(58) Field of Classification Search ............. 430/270.1, 430/905; 524/592; 525/191, 206; 526/270, 526/271, 266
See application file for complete search history.

(56) References Cited

U.S. PATENT DOCUMENTS

| 5,814,432 | A | * | 9/1998 | Kobayashi .................. 430/312 |
| 5,843,624 | A | * | 12/1998 | Houlihan et al. ........... 430/296 |
| 6,108,965 | A | * | 8/2000 | Burrows et al. ............ 528/310 |
| 6,280,897 | B1 | * | 8/2001 | Asakawa et al. ......... 430/270.1 |
| 6,303,266 | B1 | * | 10/2001 | Okino et al. ............. 430/270.1 |
| 6,313,318 | B1 | * | 11/2001 | Coulson et al. ............. 549/266 |
| 6,461,791 | B1 | * | 10/2002 | Hatakeyama et al. .... 430/270.1 |
| 6,642,346 | B1 | * | 11/2003 | Brandenburg et al. ...... 528/310 |
| 6,696,217 | B1 | * | 2/2004 | Yoon et al. .............. 430/270.1 |
| 2002/0028881 | A1 | * | 3/2002 | Brandenburg et al. ...... 525/191 |
| 2002/0155379 | A1 | * | 10/2002 | Yoon et al. .............. 430/270.1 |
| 2003/0031949 | A1 | * | 2/2003 | Barclay et al. .......... 430/270.1 |
| 2003/0130414 | A1 | * | 7/2003 | Brandenburg et al. ...... 524/592 |

FOREIGN PATENT DOCUMENTS

JP          09033736 A  *  2/1997
JP          2000-26446     1/2000

OTHER PUBLICATIONS

JP 2003-107709 Machine Translation Sato et al.*
Akiko Kotachi et al., "A Novel Plymer for a 193-nm Resist," Journal of Photopolymer Science and Technology, vol. 9, No. 3 (1996) pp. 509-522.
Mikio Yamachika et al., "Improvement of Post-Exposure Dealy Stability in Alicylic ArF Excimer Pothoresists," Journal of Photopolymer Science and Technology, vol. 12, No. 4 (1999) pp. 553-559.
Naomi Shida et al., "Advanced Materials for 196-nm Resists," Journal of Photopolymer Science and Technology, vol. 13, No. 4 (2000) pp. 691-696.
Poskonin et al., "Studies on Substituted Butane- and Butenolides. XIII. Synthesis of Copolymers of 4-Acetoxy-2-Butenolide and Vinyl Compounds." Russian Journal of Organic Chemistry, Vo. 33, No. 4, 1997, pp. 520-523. Translated by Zhurnal Organischeskoi.
Poskonin et al., "Studies on Substituted Butane- and Butenolides. XIV. Synthesis of High Molecular Butanolides on the Basis of 4-Alkoxy-2-butenolides and Vinyl Monomers." Russian Journal of Organic Chemistry, vol. 35, No. 5, 1999, pp. 721-726. Translat.

* cited by examiner

*Primary Examiner*—Yvette C. Thornton
(74) *Attorney, Agent, or Firm*—Volentine Francos & Whitt, P.L.L.C.

(57) ABSTRACT

This invention is directed to a coating composition used for original equipment manufacturing or refinishing uses in the automotive industry, which coating composition utilizes an acrylic polymer which contains substituted or unsubstituted exomethylene lactones or lactams as a comonomer.

24 Claims, No Drawings

US 7,045,267 B2

RESIST COMPOSITION COMPRISING PHOTOSENSITIVE POLYMER HAVING LACTONE IN ITS BACKBONE

CROSS-REFERENCE TO RELATED APPLICATIONS

This is a divisional of application Ser. No. 09/901,569, filed Jul. 11, 2001, now U.S. Pat. No. 6,537,727 which is incorporated herein by reference in its entirety.

BACKGROUND OF THE INVENTION

1. Field of the Invention

The present invention generally relates to a chemically amplified resist composition, and more particularly, the present invention relates to a resist composition comprising a photosensitive polymer having lactone in its backbone.

2. Description of the Related Art

As the integration density and complexity of semiconductor devices continue to increase, the ability to form ultra-fine patterns becomes more and more critical. For example, in 1-Gigabit or higher semiconductor devices, a pattern size having a design rule of 0.2 μm or less is needed. For this reason, in lithography processes, the lower wavelength ArF eximer laser (193 nm) has emerged as a preferred exposure light source to the more conventional and higher wavelength KrF eximer laser (248 nm).

However, compared with conventional (KrF) resist materials, resist materials which are suitable for use with the ArF eximer laser suffer from a variety drawbacks. The most serious problems relate transmittance and resistance to dry etching.

Almost all well-known ArF resist compositions contain (meth)acryl-based polymers. Among these polymers, a methacrylate copolymer having an alicyclic protecting group, which is expressed by the formula below, has been suggested (*J. Photopolym. Sci. Technol.*, 9(3), pp. 509 (1996))

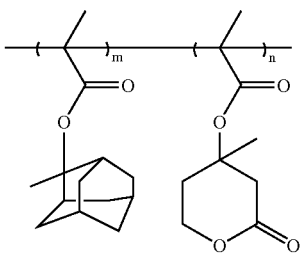

This polymer has an adamantyl group, which contributes to enhancing resistance to dry etching, and a lactone group, which improves adhesiveness, in its methacrylate backbone. As a result, the resolution of the resist and the depth of focus are improved. However, resistance to dry etching is still weak, and serious line edge roughness is observed after line patterns are formed from the resist layer.

Another drawback of the aforementioned polymer is that the raw material used to synthesize the polymer is expensive. In particular, the manufacturing cost of a polymer having a lactone group, which is introduced to improve adhesiveness, is so high that its practical use as a resist is difficult.

As another conventional resist composition, a cycloolefin-maleic anhydride (COMA) alternating polymer having the following formula has been suggested (*J. Photopolym. Sci. Technol.*, Vol. 12(4), pp. 553 (1999), and U.S. Pat. No. 5,843,624)

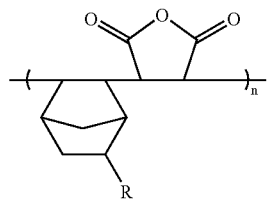

In the production of a copolymer, such as a COMA alternating polymer having the formula above, the production cost of raw material is relatively inexpensive, but the yield of the polymer sharply decreases. In addition, the transmittance of the polymer is very low at a short wavelength region, for example at 193 nm. The synthetic polymers have in their backbone the alicyclic group, which exhibits prominent hydrophobicity, and thus the adhesiveness to neighboring material layers is very poor.

The copolymer has a glass transition temperature of 200° C. or more due to the structural characteristic of the backbone. As a result, it is difficult to carry out an annealing process for eliminating free volume from the resist layer formed of the polymer, and accordingly the resist layer is influenced by ambient conditions which can cause, for example, a T-top profile of corresponding resist patterns. In addition, the resist layer itself becomes less resistant to ambient conditions during post-exposure delay, so that many problems can occur during subsequent processes with respect to the photoresist layer.

To improve the resolution of the resist layer, the polymer system must be charged with a polar group. In recent years, a technique of introducing a lactone group into a methacrylate monomer having an alicyclic protecting group, using the following alicyclic compounds with a lactone group, has been suggested so as to enhance the resistance to dry etching (*J. Photopolym. Sci. Technol.*, Vol. 13(4), pp. 601 (2000), and Japanese Patent Laid-open No. hei 12-26446):

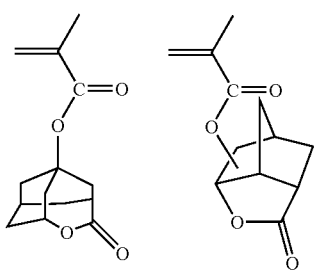

Unfortunately, the yield of the monomer having the above formula is so low as to substantially increase manufacturing costs.

SUMMARY OF THE INVENTION

It is an objective of the present invention to provide a resist composition that can be produced at relatively low costs while exhibiting improved dry etching resistance, improved adhesiveness to underlying material layers, improved line edge roughness of line patterns, and improved contrast characteristics.

To achieve the objective of the present invention, there is provided a resist composition comprising a photosensitive polymer polymerized with (a) at least one of the monomers having the respective formulae:

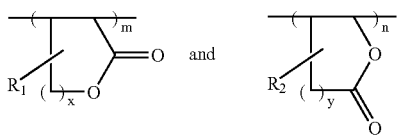

where $R_1$ and $R_2$ are independently a hydrogen atom, alkyl, hydroxyalkyl, alkyloxy, carbonyl or ester, and x and y are independently integers from 1 to 6, and (b) at least one comonomer selected from the group consisting of (meth)acrylate monomer, methacrylate monomer, maleic anhydride monomer, and norbornene monomer; and a photoacid generator (PAG).

In one embodiment of the resist composition, the comonomer may be maleic anhydride monomer, and the formula of the photosensitive polymer may be one selected from the formulae:

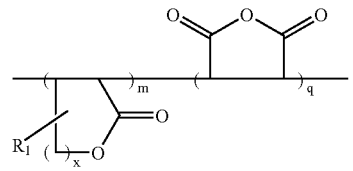

where $m/(m+q)$ is in the range of 0.01–0.5,

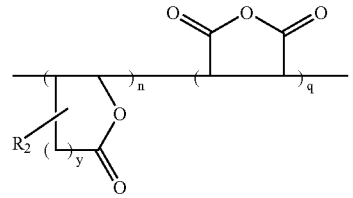

where $n/(n+q)$ is in the range of 0.01–0.5, and

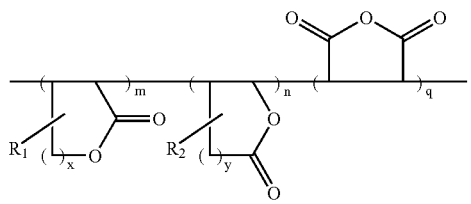

where $(m+n)/(m+n+q)$ is in the range of 0.01–0.5.

In another embodiment of the resist composition, the comonomer may include a (meth)acrylate monomer and a maleic anhydride monomer, and the formula of the photosensitive-polymer may be selected from the formulae:

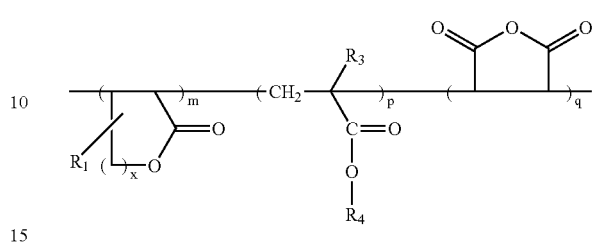

where $R_3$ is a hydrogen atom or methyl, $R_4$ is an acid-liable group, and $m/(m+p+q)$ is in the range of 0.01–0.5, $p/(m+p+q)$ is in the range of 0.1–0.6, and $q(m+p+q)$ is in the range of 0.1–0.6,

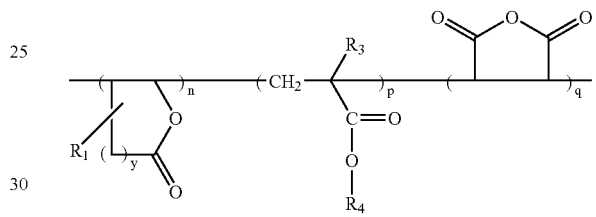

where $R_3$ is a hydrogen atom or methyl, $R_4$ is an acid-liable group, and $n/(n+p+q)$ is in the range of 0.01–0.5, $p/(n+p+q)$ is in the range of 0.1–0.6, and $q(n+p+q)$ is in the range of 0.1–0.6, and

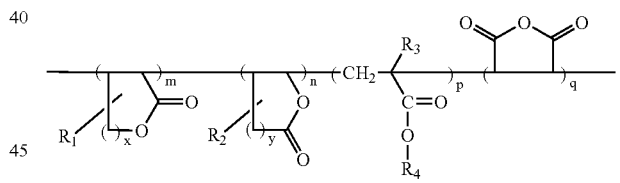

where $R_3$ is a hydrogen atom or methyl, $R_4$ is an acid-liable group, and $(m+n)/(m+n+p+q)$ is in the range of 0.01–0.5, $p/(m+n+p+q)$ is in the range of 0.1–06, and $q(m+n+p+q)$ is in the range of 0.1–0.6.

It is preferable that $R_4$ is t-butyl, tetrahydropyranyl, or substituted or unsubstituted alicyclic hydrocarbon having from 6 to 20 carbon atoms. More preferably, $R_4$ is 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

In another embodiment of the resist composition, the comonomer may include (meth)acrylate monomer, maleic anhydride monomer and norbornene monomer, and the formula of the photosensitive polymer may be one selected from the formulae:

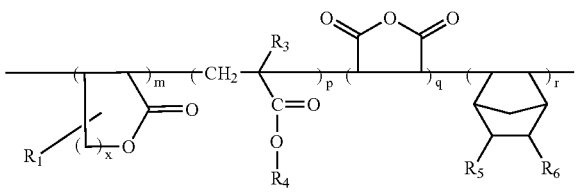

where $R_3$ is a hydrogen atom or methyl; $R_4$ is an acid-liable group; $R_5$ and $R_6$, are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$m/(m+p+q+r)$ is in the range of 0.01–0.5; $p/(m+p+q+r)$ is in the range of 0.1–0.6;

$q/(m+p+q+r)$ is in the range of 0.1–0.6; and $r/(m+p+q+r)$ is in the range of 0.1–0.3,

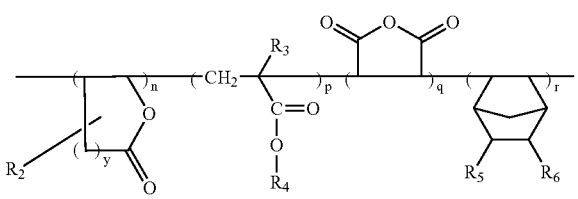

where $R_3$ is a hydrogen atom or methyl; $R_4$ is an acid-liable group; $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$n/(n+p+q+r)$ is in the range of 0.01–0.5; $p/(n+p+q+r)$ is in the range of 0.1–0.6;

$q/(n+p+q+r)$ is in the range of 0.1–0.6; and $r/(n+p+q+r)$ is in the range of 0.1–0.3, and where $R_3$ is a hydrogen atom or methyl; $R_4$ is an acid-liable group; $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$(m+n)/(m+n+p+q+r)$ is in the range of 0.01–0.5; $p/(m+n+p+q+r)$ is in the range of 0.1–0.6; $q/(m+n+p+q+r)$ is in the range of 0.1–0.6; and $r/(m+n+p+q+r)$ is in the range of 0.1–0.3.

In another embodiment, the present invention provides a resist composition comprising a photosensitive polymer polymerized with (a) at least one of the monomers having the respective formulae:

where v and w are independently integers from 1 to 6, and (b) at least one comonomer selected from the group consisting of a acrylate monomer, methacrylate monomer, maleic anhydride monomer, and norbornene monomer; and a photoacid generator (PAG).

In one embodiment of the resist composition above, the comonomer may be maleic anhydride monomer, and the formula of the photosensitive polymer may be one selected from the formulae:

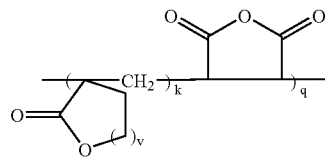

where $k/(k+q)$ is in the range of 0.01–0.5,

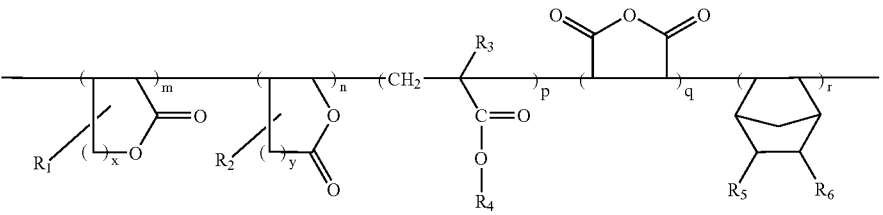

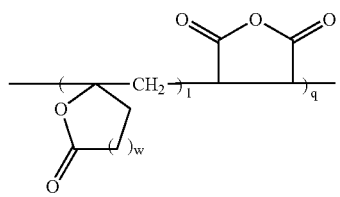

where $l/(l+q)$ is in the range of 0.01–0.5, and

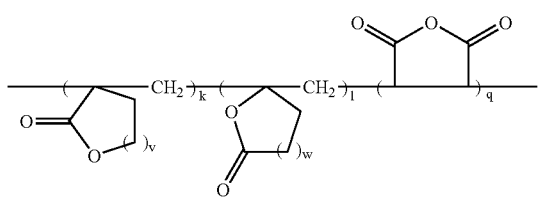

where $(k+l)/(k+l+q)$ is in the range of 0.01–0.5.

In another embodiment of the resist composition, the comonomer may include a (meth)acrylate monomer, and the formula of the photosensitive polymer may be selected from the formulae:

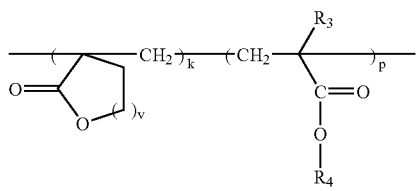

where $R_3$ is a hydrogen atom or methyl, $R_4$ is an acid-liable group, and $k/(k+p)$ is in the range of 0.3–0.8,

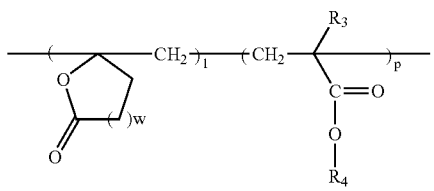

where $R_3$ is a hydrogen atom or methyl, $R_4$ is an acid-liable group, and $l/(l+p)$ is in the range of 0.3–0.8, and

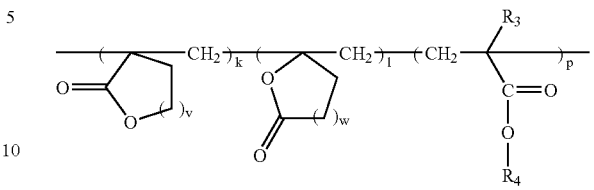

where $R_3$ is a hydrogen atom or methyl, $R_4$ is an acid-liable group, and $(k+l)/(k+l+p)$ is in the range of 0.3–0.8.

In another embodiment of the resist composition, the comonomer may include a (meth)acrylate monomer and maleic anhydride monomer, and the formula of the photosensitive polymer may be one selected from the formulae:

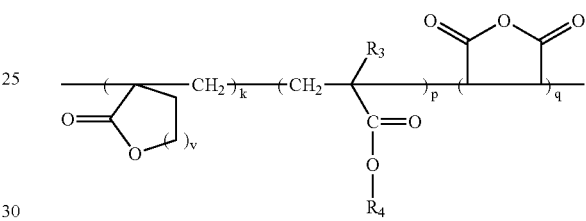

where $R_3$ is a hydrogen atom or methyl; $R_4$ is an acid-liable group; $k/(k+p+q)$ is in the range of 0.01–0.5; $p/(k+p+q)$ is in the range of 0.1–0.6; and $q/(k+p+q)$ is in the range of 0.1–0.6,

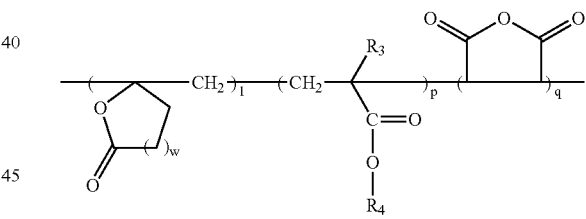

where $R_3$ is a hydrogen atom or methyl; $R_4$ is an acid-liable group; $l/(l+p+q)$ is in the range of 0.01–0.5; $p/(l+p+q)$ is in the range of 0.1–0.6; and $q/(l+p+q)$ is in the range of 0.1–0.6, and

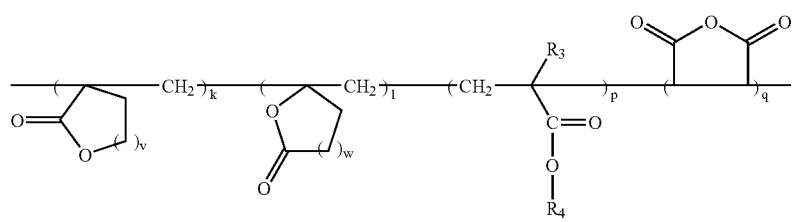

where $R_3$ is a hydrogen atom or methyl; $R_4$ is an acid-liable group; $(k+l)/(k+l+p+q)$ is in the range of 0.01–0.5; $p/(k+l+p+q)$ is in the range of 0.1–0.6; and $q/(k+l+p+q)$ is in the range of 0.1–0.6.

In another embodiment of the resist composition, the comonomer may include a maleic anhydride monomer and norbornene monomer, and the formula of the photosensitive polymer may be one selected from the formulae:

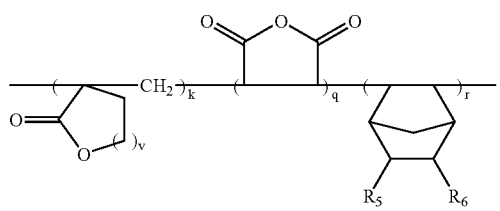

where $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$k/(k+q+r)$ is in the range of 0.01–0.5; $q/(k+q+r)$ is in the range of 0.1–0.6; and $r/(k+q+r)$ is in the range of 0.1–0.3,

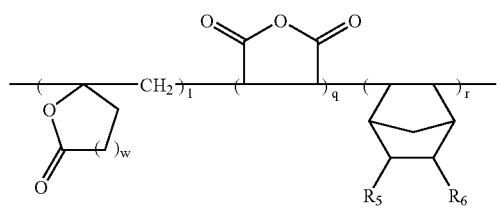

where $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$l/(l+q+r)$ is in the range of 0.01–0.5; $q/(l+q+r)$ is in the range of 0.1–0.6; and $r/(l+q+r)$ is in the range of 0.1–0.3, and

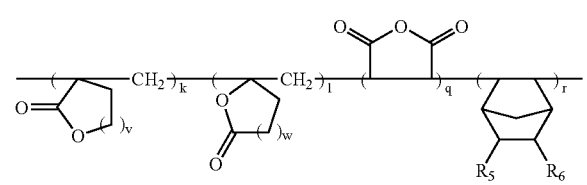

where $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$(k+l)/(k+l+q+r)$ is in the range of 0.01–0.5; $q/(k+l+q+r)$ is in the range of 0.1–0.6; and $r/(k+l+q+r)$ is in the range of 0.1–0.3.

In another embodiment of the resist composition, the comonomer may include a (meth)acrylate monomer, maleic anhydride monomer, and norbornene monomer, and the formula of the photosensitive polymer may be one selected from the formulae:

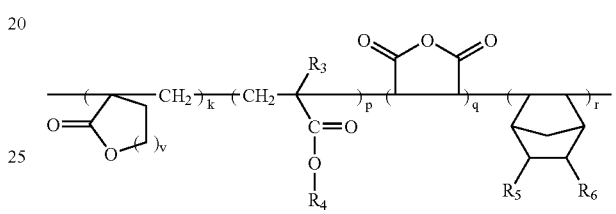

where $R_3$ is a hydrogen atom or methyl; $R_4$ is an acid-liable group; $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$k/(k+p+q+r)$ is in the range of 0.01–0.5; $p/(k+p+q+r)$ is in the range of 0.1–0.6;

$q/(k+p+q+r)$ is in the range of 0.1–0.6; and $r/(k+p+q+r)$ is in the range of 0.1–0.3,

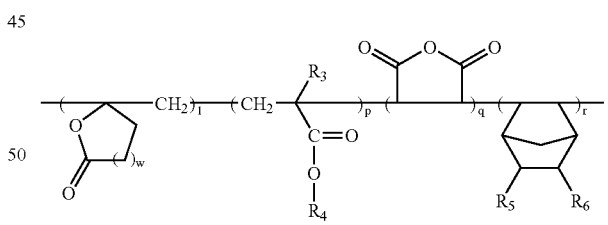

where $R_3$ is a hydrogen atom or methyl; $R_4$ is an acid-liable group; $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$l/(k+p+q+r)$ is in the range of 0.01–0.5; $p/(l+p+q+r)$ is in the range of 0.1–0.6;

$q/(l+p+q+r)$ is in the range of 0.1–0.6; and $r/(l+p+q+r)$ is in the range of 0.1–0.3, and

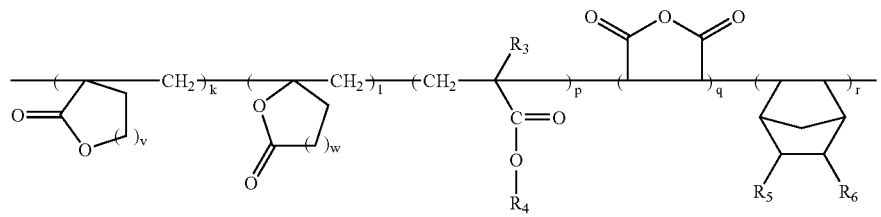

where $R_3$ is a hydrogen atom or methyl; $R_4$ is an acid-liable group; $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms;

$(k+l)/(k+l+p+q+r)$ is in the range of 0.01–0.5; $p/(k+l+p+q+r)$ is in the range of 0.1–0.6;

$q/(k+l+p+q+r)$ is in the range of 0.1–0.6; and $r/(k+l+p+q+r)$ is in the range of 0.1–0.3.

In another embodiment, the present invention provides a resist composition comprising a photosensitive polymer including at least one of the monomers having the respective formulae:

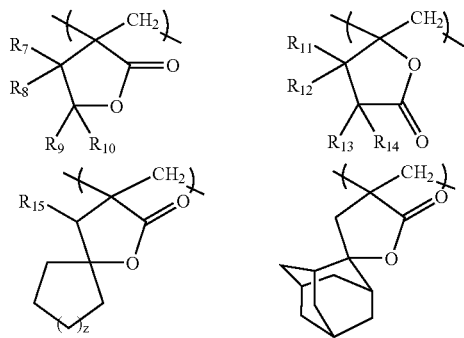

where $R_7$, $R_8$, $R_9$, $R_{10}$, $R_{11}$, $R_{12}$, $R_{13}$, $R_{14}$, and $R_{15}$ are independently a hydrogen atom or alkyl, and z is an integer from 1 to 6.

In the resist compositions according to the present invention, the photosensitive polymer has a weight average molecular weight of 3,000 to 100,000.

The amount of the photoacid generator (PAG) is in the range of 1 to 30% by weight based on the weight of the photosensitive polymer. It is preferable that the photoacid generator (PAG) comprises triarylsulfonium salts, diaryliodonium salts, sulfonates or a mixture of these materials. More preferably, the photoacid generator (PAG) comprises triphenylsulfonium triflate, triphenylsulfonium antimonate, diphenylionium triflate; diphenyliodonium antimonate, methoxydiphenyliodonium triflate, di-t-butyldiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or a mixture of these compounds.

It is preferable that the resist composition further comprises an organic base. It is preferable that the amount of the organic base is in the range of 0.01 to 2.0% by weight based on the weight of the photosensitive polymer. The organic base preferably comprises a tertiary amine compound alone or a mixture of at least two tertiary amine compounds. More preferably, the organic base comprises triethylamine, triisobutylamine, triisooctylamine, triisodecylamine, diethanolamine, triethanolamine or a mixture of these compounds.

It is preferable that the resist composition further comprises a surfactant in an amount of 30 to 200 ppm.

It is preferable that the resist composition further comprises a dissolution inhibitor in an amount of 0.1 to 50% by weight based on the weight of the photosensitive polymer.

The photosensitive polymer, which constitutes the photoresist composition according to the present invention, includes a hydrophilic cyclic lactone in its backbone. Thus, the resist composition prepared from the photosensitive polymer has superior adhesiveness to the underlying material layer, excellent resistance to dry etching, and improved transmittance. When forming line patterns from the resist layer deposited with the resist composition according to the present invention, line edge roughness characteristic is improved. The dissolution contrast characteristic, which appears after developing, sharply increases, thereby enlarging the depth of focus (DOF) margin. The photosensitive polymer of the resist composition according to the present invention has a desirable glass transition temperature, so that the resist composition prepared with the photosensitive polymer exhibits superior lithography characteristics.

DETAILED DESCRIPTION OF THE PREFERRED EMBODIMENTS

SYNTHESIS EXAMPLE 1

Synthesis of Terpolymer

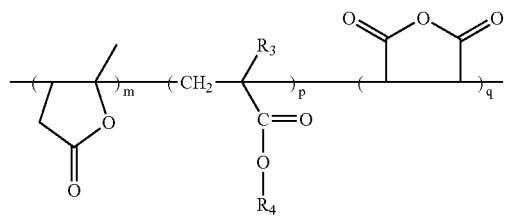

SYNTHESIS EXAMPLE 1-1

($R_3$=methyl, $R_4$=2-methyl-adamantyl)

12.0 g 2-methyladamantylmethacrylate (MAdMA), 3.4 g maleic anhydride (MA), and 1.66 g α-angelicalactone (AGL) were dissolved in 17 g tetrahydrofuran (THF). 1.38 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 72%.

The obtained terpolymer had a weight average molecular weight (Mw) of 11,400, and a polydispersity (Mw/Mn) of 2.4.

In the synthesis of the terpolymer, the mixing ratio of the monomers can be varied to adjust the solubility of the polymer. The various mixing ratios of the monomers and the characteristics of the resultant five terpolymers are listed below in Table 1.

TABLE 1

| Mixing Ratio of Monomers (MAdMa:MA:AGL) | Concentration of Initiator (mol %) | Solvent-to-Monomer ratio (by weight) | Polymerization Time (hr) | Yield (%) | Mw | Mw/Mn |
|---|---|---|---|---|---|---|
| 3:4:1 | AIBN 0.05 | 0.5 | 24 | 68 | 32,100 | 3.3 |
| 3:3:1 | AIBN 0.05 | 0.5 | 24 | 87 | 21,000 | 2.2 |
| 3:2:1 | AIBN 0.05 | 0.5 | 24 | 80 | 17,300 | 2.7 |
| 3:1:2 | V601 0.05 | 1 | 20 | 56 | 7,200 | 1.7 |
| 3:2:1 | V601 0.05 | 1 | 20 | 73 | 9,800 | 2.8 |

SYNTHESIS EXAMPLE 1-2

($R_3$=methyl, $R_4$=8-ethyl-8-tricyclo[5.2.1.0$^{2,6}$]decanyl])

14.8 g 8-ethyl-8-tricyclo[5.2.1.0$^{2,6}$]decanylmethacrylate (ETCDMA), 3.4 g maleic anhydride (MA), and 1.66 g α-angelicalactone (AGL) were dissolved in 20 g tetrahydrofuran (THF). 1.38 g dimethyl 2,2'-azobisisobutyrate (V601) was added into the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 65%.

The obtained terpolymer had a weight average molecular weight (Mw) of 12,100, and a polydispersity (Mw/Mn) of 2.6.

SYNTHESIS EXAMPLE 1-3

($R_3$=methyl, $R_4$=1-methylcyclohexyl)

5.5 g 1-methylcyclohexylmethacrylate (MChMA), 1.7 g maleic anhydride (MA), and 0.83 g α-angelicalactone (AGL) were dissolved in 8 g tetrahydrofuran (THF). 0.69 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 71%.

The obtained terpolymer had a weight average molecular weight (Mw) of 11,000, and a polydispersity (Mw/Mn) of 2.6.

SYNTHESIS EXAMPLE 2

Synthesis of Tetrapolymer

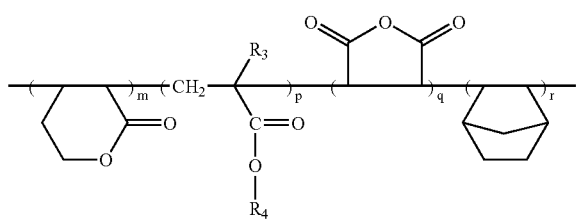

In the above formula, $R_3$ is methyl and $R_4$ is 2-methyl-adamantyl.

6 g 2-methyladamantylmethacrylate (MAdMA), 1.9 g maleic anhydride (MA), 1.0 g 5,6-dihydro-2H-pyrane-2-one (DHPone) and 0.63 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 71%.

The obtained tetrapolymer had a weight average molecular weight (Mw) of 12,000, and a polydispersity (Mw/Mn) of 2.1.

SYNTHESIS EXAMPLE 3

Synthesis of Tetrapolymer

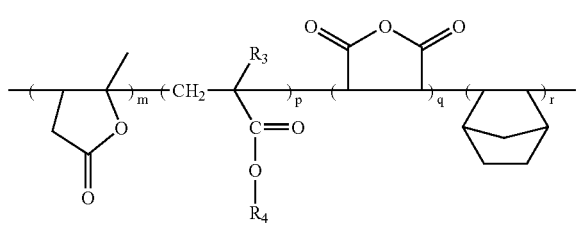

In the above formula, $R_3$ is methyl and $R_4$ is 2-methyl-adamantyl.

6 g 2-methyladamantylmethacrylate (MAdMA), 1.9 g maleic anhydride (MA), 1.2 g α-angelicalactone (AGL) and 0.63 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 72%.

The obtained tetrapolymer had a weight average molecular weight (Mw) of 12,600, and a polydispersity (Mw/Mn) of 1.9.

In the synthesis of the tetrapolymer, the mixing ratio of the monomers can be varied to adjust the solubility of the polymer. The various mixing ratios of the monomers, and the characteristics of the resultant six tetrapolymers are listed below in Table 2.

TABLE 2

| Mixing Ratio of Monomers (MAdMA:MA:Nb:AGL) | Concentration of Initiator (mol %) | Solvent-to-Monomer ratio (by weight) | Polymerization Time (hr) | Yield (%) | Mw | Mw/Mn |
|---|---|---|---|---|---|---|
| 4:3:2:1 | V601 0.05 | 1 | 24 | 74 | 8,300 | 2.6 |
| 4:3:1:2 | V601 0.05 | 1 | 24 | 62 | 7,700 | 2.1 |
| 4:3:2:2 | V601 0.05 | 1 | 24 | 65 | 6.700 | 2.2 |
| 4:2:2:2 | V601 0.05 | 1 | 20 | 59 | 6,700 | 2.0 |
| 4::1:1:2 | V601 0.05 | 1 | 20 | 31 | 6,800 | 1.7 |
| 4:1:1:3 | V601 0.05 | 1 | 20 | 62 | 5,600 | 1.6 |

SYNTHESIS EXAMPLE 4

Synthesis of Terpolymer

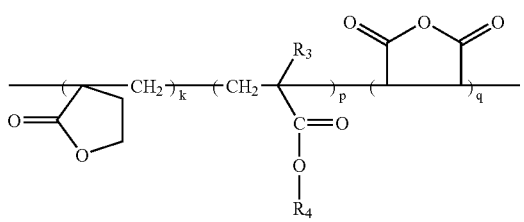

In the above formula, $R_3$ is methyl and $R_4$ is 2-methyl-adamantyl.

12.0 g 2-methyladamantylmethacrylate (MAdMA), 3.4 g maleic anhydride (MA), and 1.66 g α-methylenebutyrolactone (α-MBL) were dissolved in 17 g tetrahydrofuran (THF). 1.38 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 73%.

The obtained terpolymer had a weight average molecular weight (Mw) of 15,400, and a polydispersity (Mw/Mn) of 2.9.

SYNTHESIS EXAMPLE 5

Synthesis of Tetrapolymer

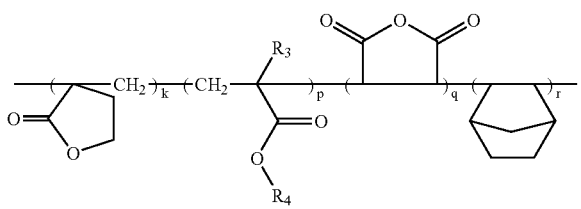

SYNTHESIS EXAMPLE 5-1

($R_3$=methyl, $R_4$=2-methyl-adamantyl)

6 g 2-methyladamantylmethacrylate (MAdMA), 1.88 g maleic anhydride (MA), 0.63 g α-methylenebutyrolactone (α-MBL), and 1.21 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 88%.

The obtained tetrapolymer had a weight average molecular weight (Mw) of 15,800, and a polydispersity (Mw/Mn) of 3.3.

In the synthesis of the tetrapolymer, the mixing ratio of the monomers can be varied to adjust the solubility of the polymer. The various mixing ratios of the monomers, and the characteristics of the resultant three tetrapolymers are listed below in Table 3.

TABLE 3

| Mixing Ratio of Monomers (MAdMA:MA: α-MBL:Nb) | Concentration of Initiator (mol %) | Solvent-to-Monomer ratio (by weight) | Polymerization Time (hr) | Yield (%) | Mw | Mw/Mn |
|---|---|---|---|---|---|---|
| 3:3:1:2 | V601 0.05 | 1 | 20 | 87 | 13,300 | 3.6 |
| 4:3:1:2 | V601 0.05 | 1 | 20 | 88 | 15,800 | 3.4 |
| 5:3:1:2 | V601 0.05 | 1 | 20 | 86 | 18,600 | 3.7 |

SYNTHESIS EXAMPLE 5-2

($R_3$=methyl, $R_4$=2-methyl-adamantyl)

6.4 g 2-ethyladamantylmethacrylate (EAdMA), 1.88 g maleic anhydride (MA), 0.63 g α-methylenebutyrolactone (α-MLB), and 1.21 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 78%.

The obtained tetrapolymer had a weight average molecular weight (Mw) of 11,600, and a polydispersity (Mw/Mn) of 3.0.

SYNTHESIS EXAMPLE 5-3

($R_3$=hydrogen, $R_4$=2-methyl-adamantyl)

6.2 g 2-methyladamantylacrylate (MAdA), 2.06 g maleic anhydride (MA), 0.69 g α-methylenebutyrolactone (αMBL), and 1.32 g norbornene (Nb) were dissolved in 9.7 g tetrahydrofuran (THF). 0.74 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 76%.

The obtained tetrapolymer had a weight average molecular weight (Mw) of 7,010, and a polydispersity (Mw/Mn) of 1.96.

SYNTHESIS EXAMPLE 6

Synthesis of Tetrapolymer

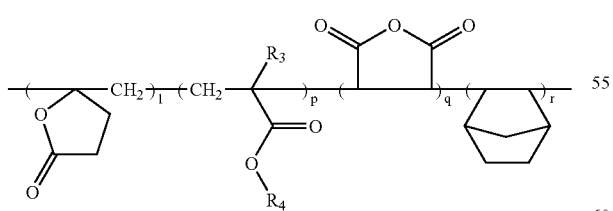

In the above formula, $R_3$ is methyl and $R_4$ is 2-methyladamantyl.

6.4 g 2-methyladamantylmethacrylate (MAdMA), 1.88 g maleic anhydride (MA), 0.63 g γ-methylenebutyrolactone (γ-MBL), and 1.21 g norbornene (Nb) were dissolved in 9.7 g tetrahydrofuran (THF). 0.74 g dimethyl-2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 82%.

The obtained tetrapolymer had a weight average molecular weight (Mw) of 14,300, and a polydispersity (Mw/Mn) of 2.8.

SYNTHESIS EXAMPLE 7

Synthesis of Monomer

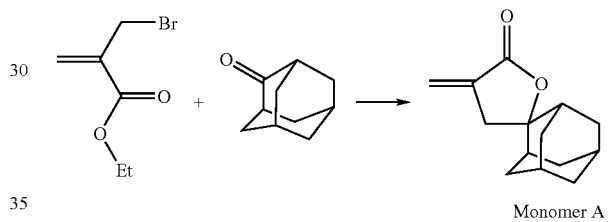

Monomer A

A solution of 30 g 2-bromomethylacrylic acid ethyl ester in 100 ml anhydrous THF was added dropwise with vigorous stirring under nitrogen to a mixture of 10.6 g zinc and 15.5 g adamantanone in 50 ml anhydrous THF. The reaction mixture was reacted at 60° C. for 10 hours. The reaction product was cooled down to room temperature, poured into 500 ml diluted hydrochloric acid solution, and extracted with 700 ml ether twice. The extracted solution was washed with 400 ml aqueous sodium hydrogencarbonate ($NaHCO_3$) and with 400 ml water, and then dried over anhydrous sodium sulfate ($Na_2SO_4$). The dried product was evaporated with ether under reduced pressure. The residue was recrystallized from methylene dichloride and hexane, so that white solid monomer A was obtained with a yield of 62%.

SYNTHESIS EXAMPLE 8

Synthesis of Terpolymer

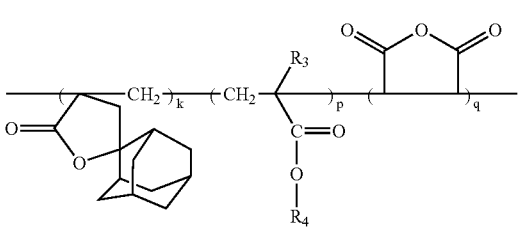

In the above formula, $R_3$ is methyl and $R_4$ is 2-methyladamantyl.

7.03 g 2-methyladamantylmethacrylate (MAdMA), 1.96 g maleic anhydride (MA), and 2.18 g Monomer A synthesized in SYNTHESIS EXAMPLE 7 were dissolved in 11.2 g tetrahydrofuran (THF). 0.69 g dimethyl 2,2'-azobisisobutyrate (V601) was added to the solution, degassed and polymerized at 70° C. for 4 hours.

After the reaction was completed, the obtained reaction product was precipitated with excess isopropyl alcohol twice, filtered, and dried in a vacuum oven for 24 hours, so that the tetrapolymer having the formula above was obtained with a yield of 86%.

The obtained terpolymer had a weight average molecular weight (Mw) of 8,200, and a polydispersity (Mw/Mn) of 2.0.

In the synthesis of the terpolymer, the mixing ratio of the monomers can be varied. The various mixing ratios of the monomers, and the characteristics of the resultant three terpolymers are listed below in Table 4.

TABLE 4

| Mixing Ratio of Monomers (MAdMA:MA: Monomer A) | Concentration of Initiator (mol %) | Solvent-to-Monomer ratio (by weight) | Polymerization Time (hr) | Yield (%) | Mw | Mw/Mn |
|---|---|---|---|---|---|---|
| 3:6:1 | V601 0.05 | 1 | 4 | 62 | 5,700 | 2.1 |
| 3:4:1 | V601 0.05 | 1 | 4 | 72 | 7,000 | 2.0 |
| 3:2:1 | V601 0.05 | 1 | 4 | 86 | 8,200 | 2.0 |

SYNTHESIS EXAMPLE 9

Synthesis of Tetrapolymer

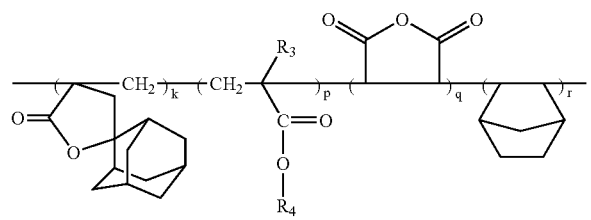

In the above formula, $R_3$ is methyl and $R_4$ is 2-methyladamantyl.

9.7 g 2-methyladamantylmethacrylate (MAdMA), 4.06 g maleic anhydride (MA), 3 g Monomer A synthesized in SYNTHESIS EXAMPLE 7, and 2.6 g norbornene (Nb) were dissolved in 19.6 g tetrahydrofuran (THF). 1.6 g dimethyl 2,2'-azobisisobutyrate (V601) was added to the solution, degassed and polymerized at 70° C. for 20 hours.

After the reaction was completed, the obtained reaction product was precipitated with excess isopropyl alcohol twice, filtered, and dried in a vacuum oven for 24 hours, so that the tetrapolymer having the formula above was obtained with a yield of 86%.

The obtained tetrapolymer had a weight average molecular weight (Mw) of 5,500, and a polydispersity (Mw/Mn) of 2.4.

EXAMPLE 1

Preparation of Resist Composition 1.0 g each of the polymers obtained in SYNTHESIS EXAMPLEs 1-1 through 1-3, SYNTHESIS EXAMPLE 2, and SYNTHESIS EXAMPLE 3, 0.01 g triphenylsulfonium trifluoromethanesulfonate (triflate) as a photoacid generator (PAG), and 3.2 mg triisodecylamine as an organic base, were completely dissolved in a mixed, solution of 4.0 g propylene glycol monomethyl ether acetate (PGMEA) and 4.0 g cyclohexanone, and filtered through a membrane filter of 0.2 μm, so that resist compositions were obtained. Each of the resist compositions was coated on a silicon (Si) wafer treated with organic anti-reflective coating (ARC) to a thickness of about 0.35 μm.

The wafers coated with the respective resist compositions were soft baked at 130° C. for 90 seconds, exposed using an ArF eximer laser stepper (NA=0.6), and subjected to a post-exposure bake (PEB) at 120° C. for 60 seconds.

The resultant wafers were developed using 2.38% by weight tetramethylammonium hydroxide solution for about 60 seconds. As a result, 0.17–0.23 μm line and space patterns of photoresist were formed with an exposure dosage of 10 to 30 mJ/cm².

EXAMPLE 2

Preparation of Resist Composition 1.0 g each of the polymers obtained in SYNTHESIS EXAMPLE 4, Synthesis Examples 5-1 through 5-3, and SYNTHESIS EXAMPLE 6, 0.01 g triflate as a PAG, and 3.2 mg triisodecylamine as an organic base, were completely dissolved in a mixed solution of 4.0 g PGMEA and 4.0 g cyclohexanone, and filtered through a membrane filter of 0.2 μm, so that resist compositions were obtained. Each of the resist compositions was coated on a silicon (Si) wafer treated with organic anti-reflective coating (ARC) to a thickness of about 0.35 μm.

The wafers coated with the respective resist compositions were soft baked at 130° C. for 90 seconds, exposed using an ArF eximer laser stepper (NA=0.6), and subjected to a post-exposure bake (PEB) at 120° C. for 60 seconds.

The resultant wafers were developed using 2.38% by weight tetramethylammonium hydroxide solution for about 60 seconds. As a result, 0.17–0.23μ line and space pattern of photoresist were formed with an exposure dosage of 10 to 30 mJ/cm².

The photosensitive polymer, which constitutes the photoresist composition according to the present invention, includes a cyclic lactone in its backbone. Thus, the manufacturing cost is very low, and the problems of the conventional polymers used in the production of ArF resists can be largely overcome. The resist composition prepared from the photosensitive polymer exhibits excellent resistance to dry etching, superior adhesiveness to underlying material layers, and improved transmittance. The cyclic lactone included in the polymer backbone is highly hydrophilic. When forming space and line patterns from the resist layer deposited with the resist composition according to the present invention, line edge roughness characteristic is improved. The dissolution contrast characteristic, which appears after developing, sharply increases, thereby enlarging the depth of focus (DOF) margin.

The photosensitive polymer of the resist composition according to the present invention has a desirable glass transition temperature of 140 to 180° C. As for the resist layer which contains the photosensitive polymer according to the present invention, the free volume of the resist layer can be decreased due to a sufficient annealing effect during a baking process. As a result, the resist layer becomes more resistant to the ambient environment during post-exposure delay (PED). Thus, use of the resist composition according to the present invention in a photolithography process exhibits superior lithography characteristics, and is therefore useful in the manufacture of future generation semiconductor devices.

While this invention has been particularly shown and described with reference to preferred embodiments thereof, it will be understood by those skilled in the art that various changes in form and details may be made thereto without departing from the spirit and scope of the invention as defined by the appended claims.

It is noted that priority has been claimed to Korean Patent Application No. 00-39562, filed 11 Jul. 2000, and Korean Patent Application No. 00-75485, filed 12 Dec. 2000. Both of these Korean application are incorporated herein in their entirety.

What is claimed is:

1. A resist composition comprising:
   a photosensitive polymer polymerized with (a) at least one of the monomers having the respective formulae:

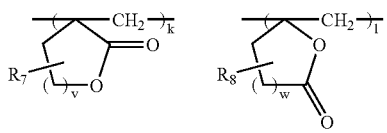

where R7 and R8 are independently an alkyl, hydroxyalkyl, alkyloxy, carbonyl or ester, and v and w are independently integers from 1 to 6, and (b) at least one comonomer selected from the group consisting of a (meth)acrylate monomer, methacrylate monomer, maleic anhydride monomer, and norbornene monomer; and
   a photoacid generator (PAG).

2. The resist composition of claim 1, wherein the comonomer includes a (meth)acrylate monomer, and the formula of the photosensitive polymer is selected from the formulae:

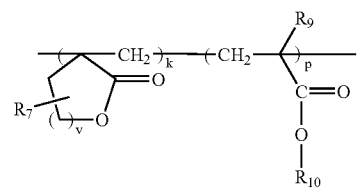

where R9 is a hydrogen atom or methyl, R10 is an acid-liable group, and k/(k+p) is in the range of 0.3–0.8,

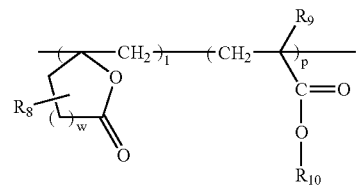

where R9 is a hydrogen atom or methyl, R10 is an acid-liable group, and l/(l+p) is in the range of 0.3–0.8, and

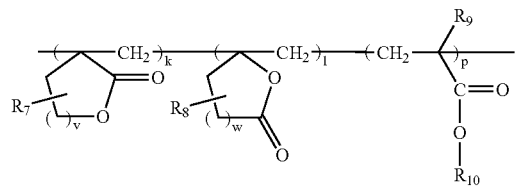

where R9 is a hydrogen atom or methyl, RiO is an acid-liable group, and (k+l)/(k+l+p) is in the range of 0.3–0.8.

3. The resist composition of claim 2, wherein R10 is t-butyl, tetrahydropyranyl, or substituted or unsubstituted alicyclic hydrocarbon having from 6 to 20 carbon atoms.

4. The resist composition of claim 3, wherein R10 is 2-methyl-2-norbornyl, 2-ethyl-2-norbornyl, 2-methyl-2-isobornyl, 2-ethyl-2-isobornyl, 8-methyl-8-tricyclo[5.2.1.02,6]decanyl, 8-ethyl-8-tricyclo[5.2.1.02,6]decanyl, 2-methyl-2-adamantyl, 2-ethyl-2-adamantyl, 1-adamantyl-1-methylethyl, 2-methyl-2-fenchyl or 2-ethyl-2-fenchyl.

5. The resist composition of claim 1, wherein the comonomer is a maleic anhydride monomer, and the formula of the photosensitive polymer is one selected from the formulae:

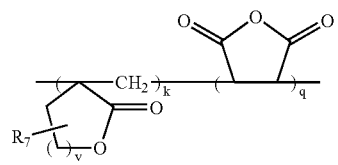

where k(k+q) is in the range of 0.0 1–0.5,

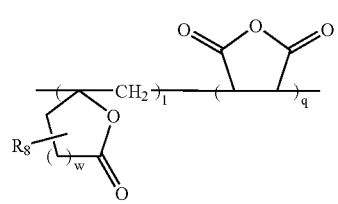

where l/(l+q) is in the range of 0.01–0.5, and

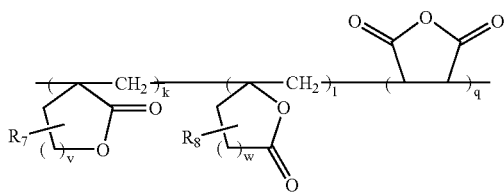

where (k+l)/(k+l+q) is in the range of 0.01–0.5.

6. The resist composition of claim 1, wherein the comonomer is norbornene monomer, and the formula of the photosensitive polymer is one selected from the formulae:

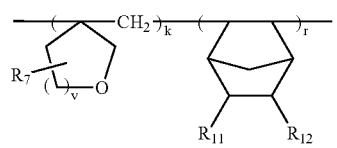

where R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms, and where k/(k+r) is in the range of 0.01–0.5,

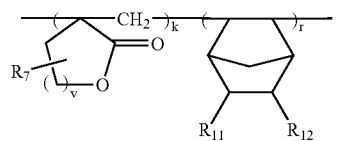

where R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms, and where l/(l+r) is in the range of 0.01–0.5, and

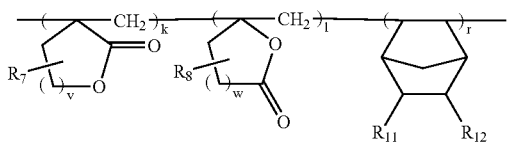

where R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms, and where (k+l)/(k+l+r) is in the range of 0.0 1–0.5.

7. The resist composition of claim 6, wherein R10 is t-butyl, tetrahydropyranyl, or substituted or unsubstituted alicyclic hydrocarbon having from 6 to 20 carbon atoms.

8. The resist composition of claim 6, wherein R10 is 2-methyl-2-norbornyl, 2-ethyl-2-norbornyl, 2-methyl-2-isobornyl, 2-ethyl -2-isobornyl, 8-methyl-8-tricyclo[5.2.1.02,6]decanyl, 8-ethyl-8-tricyclo[5.2.1.02,6]decanyl, 2-methyl-2-adamantyl, 2-ethyl-2-adamantyl, 1-adamantyl-1-methylethyl, 2-methyl-2-fenchyl or 2-ethyl-2-fenchyl.

9. The resist composition of claim 1, wherein the comonomer includes a (meth)acrylate monomer and maleic anhydride monomer, and the formula of the photosensitive polymer is selected from the formulae:

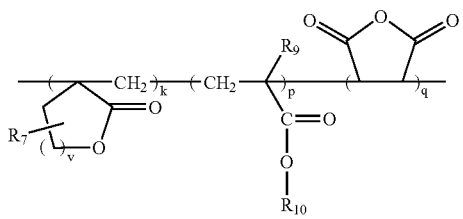

where R9 is a hydrogen atom or methyl, R10 is an acid-liable group, and k/(k+p+q) is in the range of 0.01–0.5, p/(k+p+q) is in the range of 0.1–0.6, and q(k+p+q) is in the range of 0.1–0.6,

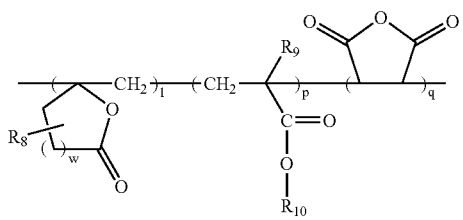

where R9 is a hydrogen atom or methyl, R10 is an acid-liable group, and l/(l+p+q) is in the range of 0.01–0.5, p/(l+p+q) is in the range of 0.1–0.6, and q(l+p+q) is in the range of 0.1–0.6, and

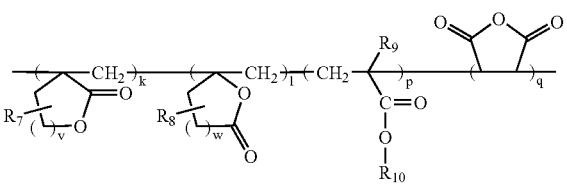

where R9 is a hydrogen atom or methyl, R10 is an acid-liable group, and (k+l)/(k+l+p+q) is in the range of 0.01–0.5, p/(k+l+p+q) is in the range of 0.1–06, and q(k+l+p+q) is in the range of 0.1–0.6.

10. The resist composition of claim 9, wherein R10 is t-butyl, tetrahydropyranyl, or substituted or unsubstituted alicyclic hydrocarbon having from 6 to 20 carbon atoms.

11. The resist composition of claim 10, wherein R10 is 2-methyl-2-norbomyl, 2-ethyl-2-norbornyl, 2-methyl-2-isobornyl, 2-ethyl-2-isobomyl, 8-methyl-8-tricyclo[5.2.1.02,6]decanyl, 8-ethyl-8-tricyclo[5.2.1.02,6]decanyl, 2-methyl-2-adamantyl, 2-ethyl-2-adamantyl, 1-adamantyl-1-methylethyl, 2-methyl-2-fenchyl or 2-ethyl-2-fenchyl.

12. The resist composition of claim 1, wherein the comonomer includes a (meth)acrylate monomer and norbomene monomer, and the formula of the photosensitive polymer is selected from the formulae:

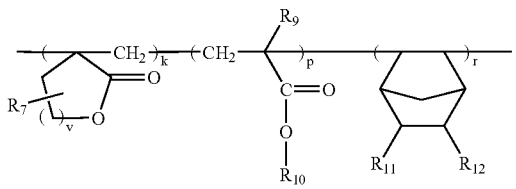

where R9 is a hydrogen atom or methyl; R10 is an acid-liable group; R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; k/(k+p+r) is in the range of 0.01–0.5, p/(k+p+r) is in the range of 0.1–0.6, and q(k+p+r) is in the range of 0.1–0.6,

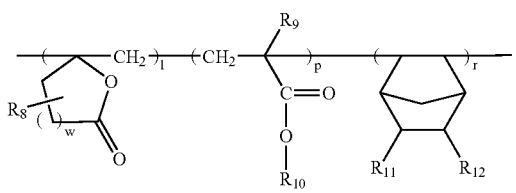

where R9 is a hydrogen atom or methyl; R10 is an acid-liable group; R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; l/(l+p+r) is in the range of 0.01–0.5, p/(l+p+r) is in the range of 0.1–0.6, and q(l+p+r) is in the range of 0.1–0.6, and

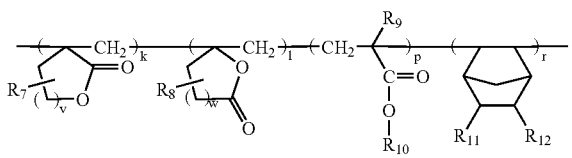

where R9 is a hydrogen atom or methyl; R10 is an acid-liable group; R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; (k+l)/(k+l+p+r) is in the range of 0.01–0.5, p/(k+l+p+r) is in the range of 0.1–06, and q(k+l+p+r) is in the range of 0.1–0.6.

13. The resist composition of claim 1, wherein the comonomer includes maleic anhydride monomer and nor bornene monomer, and the formula of the photosensitive polymer is selected from the formulae:

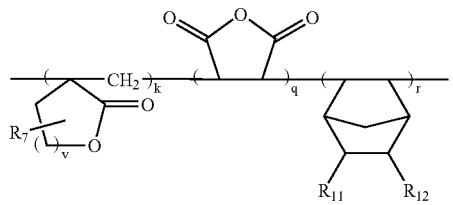

where R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; k/(k+q+r) is in the range of 0.01–0.5, q/(k+q+r) is in the range of 0.1–0.6, and r(k+q+r) is in the range of 0.1–0.6,

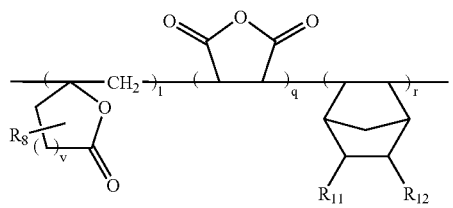

where R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; l/(l+q+r) is in the range of 0.01–0.5, q/(l+q+r) is in the range of 0.1–0.6, and r(l+q+r) is in the range of 0.1–0.6, and

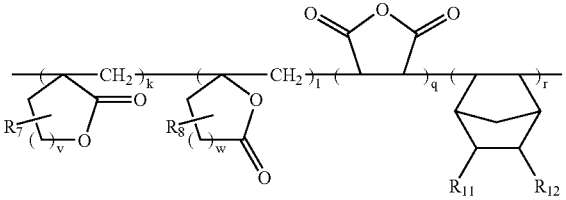

where R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; (k+l)/(k+l+q+r) is in the range of 0.01–0.5, q/(k+l+q+r) is in the range of 0.1–06, and r(k+l+q+r) is in the range of 0.1–0.6.

14. The resist composition of claim 1, wherein the comonomer includes a (meth)acrylate monomer, maleic anhydride monomer and norbornene monomer, and the formula of the photosensitive polymer is one selected from the formulae:

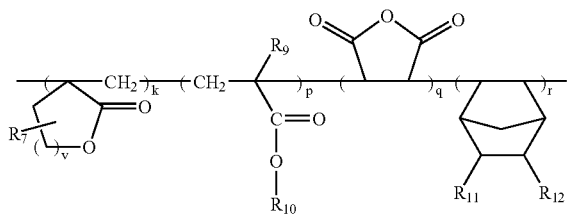

where R9 is a hydrogen atom or methyl; R10 is an acid-liable group; R11 and R12 are independently hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $k/(k+p+q+r)$ is in the range of 0.01–0.5; $p/(k+p+q+r)$ is in the range of 0.1–0.6; $q/(k+p+q+r)$ is in the range of 0.1–0.6; and $r/(k+p+q+r)$ is in the range of 0.1–0.3,

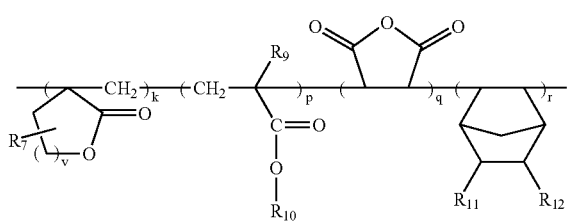

where R9 is a hydrogen atom or methyl; R10 is an acid-liable group; R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms; $n/(n+p+q+r)$ is in the range of 0.01–0.5; $p/(n+p+q+r)$ is in the range of 0.1–0.6;

$q/(n+p+q+r)$ is in the range of 0.1–0.6; and $r/(n+p+q+r)$ is in the range of 0.1–0.3, and

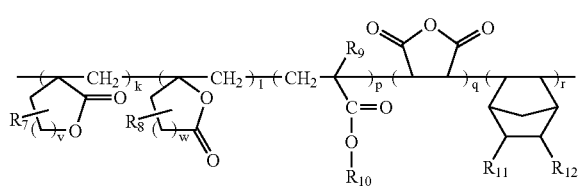

where R9 is a hydrogen atom or methyl; R10 is an acid-liable group; R11 and R12 are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having from 6 to 20 carbon atoms, $(k+l)/(k+l+p+q+r)$ is in the range of 0.01–0.5; $p/(k+l+p+q+r)$ is in the range of 0.1–0.6; $q/(k+l+p+q+r)$ is in the range of 0.1–0.6; and $r/(k+l+p+q+r)$ is in the range of 0.1–0.3.

15. The resist composition of claim 1, wherein the photosensitive polymer has a weight average molecular weight of 3,000 to 100,000.

16. The resist composition of claim 1, wherein the amount of the photoacid generator (PAG) is in the range of 1 to 30% by weight based on the weight of the photosensitive polymer.

17. The resist composition of claim 1, wherein the photoacid generator (PAG) comprises at least one of triarylsulfonium salts, diaryliodonium salts, and sulfonates.

18. The resist composition of claim 1, wherein the photoacid generator (PAG) comprises at least one of triphenylsulfonium triflate, triphenylsulfonium antimonate, diphenylionium triflate, diphenyliodonium antimonate, methoxydiphenyliodonium triflate, di-t-butyidiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyidiphenyliodonium nonaflate, N-hydroxysuccinimide nonaflate, norbornene-dicarboximide-nonaflate, triphenylsulfonium perfluorooctanesulfonate (PFOS), diphenyliodonium PFOS, methoxydiphenyliodonium PFOS, di-t-butyidiphenyliodonium triflate, N-hydroxysuccinimide PFOS, and norbornene-dicarboximide PFOS.

19. The resist composition of claim 1, further comprising an organic base.

20. The resist composition of claim 19, wherein the amount of the organic base is in the range of 0.01 to 2.0% by weight based on the weight of the photosensitive polymer.

21. The resist composition of claim 19, wherein the organic base comprises at least one tertiary amine compound.

22. The resist composition of claim 21, wherein the organic base comprises at least one of triethylamine, triisobutylamine, triisooctylamine, triisodecylamine, diethanolamine, and triethanolamine.

23. The resist composition of claim 1, further comprising a surfactant in an amount of 30 to 200 ppm.

24. The resist composition of claim 1, further comprising a dissolution inhibitor in an amount of 0.1 to 50% by weight based on the weight of the photosensitive polymer.

* * * * *